United States Patent
Oehrlein et al.

[11] Patent Number: 6,060,400
[45] Date of Patent: May 9, 2000

[54] HIGHLY SELECTIVE CHEMICAL DRY ETCHING OF SILICON NITRIDE OVER SILICON AND SILICON DIOXIDE

[75] Inventors: Gottlieb S. Oehrlein, Voorheesville; Bernd Kastenmeier; Peter Matsuo, both of Albany, all of N.Y.

[73] Assignee: The Research Foundation of State University of New York, Albany, N.Y.

[21] Appl. No.: 09/048,848

[22] Filed: Mar. 26, 1998

[51] Int. Cl.$^7$ .............................................. H01L 21/3065
[52] U.S. Cl. .......................................... 438/706; 723/724
[58] Field of Search ................... 438/706, 724, 438/723

[56] References Cited

U.S. PATENT DOCUMENTS

| | | | |
|---|---|---|---|
| 4,174,251 | 11/1979 | Paschke | 438/714 |
| 4,175,235 | 11/1979 | Niwa et al. | 250/542 |
| 4,568,410 | 2/1986 | Thornquist | 438/724 |
| 4,671,851 | 6/1987 | Beyer et al. | 156/645 |
| 4,786,352 | 11/1988 | Benzing | 156/345 |
| 5,437,765 | 8/1995 | Loewenstein | 216/51 |
| 5,468,665 | 11/1995 | Lee et al. | 437/44 |
| 5,472,508 | 12/1995 | Saxena | 118/723 |
| 5,491,099 | 2/1996 | Hsu | 437/35 |
| 5,505,816 | 4/1996 | Barnes et al. | 438/695 |
| 5,693,979 | 12/1997 | Sato | 257/588 |
| 5,786,276 | 7/1998 | Brooks et al. | 438/724 |
| 5,861,065 | 1/1999 | Johnson | 134/22.1 |

OTHER PUBLICATIONS

Matsuo et al., "Role of N2 addition on CF4/O2 remote plasma chemical dry etching of polycrystalline silicon", J. Vac. Sci. Technol. A 15(4), 1997 American Vacuum Society, Jul./Aug. 1997, pp. 1801–1813.

Kastenmeier et al., "Chemical dry etching of silicon nitride and silicon dioxide using CF4/O2/N2 gas mixtures", J. Vac. Sci. Technol. A 14(5), 1996 American Vacuum Society, Sep./Oct. 1996, pp. 2802–2813.

*Primary Examiner*—Benjamin Utech
*Assistant Examiner*—Lynette T. Umez-Eronini
*Attorney, Agent, or Firm*—Heslin & Rothenberg, P.C.

[57] ABSTRACT

A dry etch process is described for removing silicon nitride masks from silicon dioxide or silicon for use in a semiconductor fabrication process. A remote plasma oxygen/nitrogen discharge is employed with small additions of a fluorine source. The gas mixture is controlled so that atomic fluorine within the reaction chamber is maintained at very low flows compared with the oxygen and nitrogen reactants. Parameters are controlled so that an oxidized reactive layer is formed above any exposed silicon within a matter of seconds from initiating etching of the silicon nitride. Etch rates of silicon nitride to silicon of greater than 30:1 are described, as well as etch rates of silicon nitride to silicon dioxide of greater than 70:1.

11 Claims, 15 Drawing Sheets

HIGHLY SELECTIVE CHEMICAL DRY ETCHING OF SILICON NITRIDE OVER SILICON AND SILICON DIOXIDE

TECHNICAL FIELD

This invention relates to processes for making semiconductor devices, and more particularly, to a practical process for selective chemical dry etching of silicon nitride with respect to silicon and/or with respect to silicon dioxide.

BACKGROUND OF THE INVENTION

Silicon integrated circuits typically electrically isolate individual field effect transistors, bipolar transistors, and any substrate resistors and other elements with silicon dioxide ("oxide") regions at the surface of a silicon wafer. These oxide isolation regions can be directly formed by a thermal oxidation of a silicon wafer with an oxidation barrier such as silicon nitride ("nitride") masking off areas which will eventually contain transistors, substrate resistors, and other elements. This method of oxidation of selected regions of a silicon wafer has acquired the acronym LOCOS ("local oxidation of silicon").

Typical LOCOS includes using a thin oxide layer between the nitride mask and the silicon wafer to provide stress relief during thermal oxidation. However, thermal oxidation of silicon proceeds essentially isotropically, and the oxidation encroaches under the nitride mask along the pad oxide to form an oxide wedge. FIGS. 1–2 illustrate LOCOS with nitride mask 102 on pad oxide 104 which is on silicon wafer 106. FIG. 1 is prior to thermal oxidation and FIG. 2 is after thermal oxidation, which forms isolation oxide 110. As shown, wedges 110 warp nitride 102 and may generate defects in the adjacent silicon wafer due to the stresses generated.

The stripping of silicon nitride mask material after the local oxidation of silicon is a possible source of damage to the pad oxide and/or the underlying device area silicon. For example, the pad oxide can suffer degradation during an over-etch or etchants can reach the underlying silicon substrate through imperfections in the pad oxide. Using current etch techniques, etching of silicon occurs at a significant rate and the result can be craters in the substrate, which are referred to as "pitting".

Removal of the nitride mask 102 after LOCOS thermal oxidation requires a nitride etch which will stop on the pad oxide and thereby avoid damaging the underlying device area silicon. The standard nitride etch uses a bath of hot phosphoric acid ($H_3PO_4$) which is highly selective to oxide. However, wet etches introduce undesired contamination of a wafer for two reasons: liquids typically cannot be purified sufficiently and the wafer must be removed from the oxidation chamber for the wet nitride stripping (plus pad oxide removal and cleanup) and then reinserted into the process chamber for subsequent steps, typically a thermal oxidation to form gate oxide. An all dry processing sequence for nitride stripping can avoid the wet etch and the removal/reinsertion contamination sources.

Nitride can also be used in other integrated circuit processing steps which subsequently require isotropic stripping. For example, a wafer with a nitride backside seal and a frontside deposited protective oxide may require a selective nitride strip to avoid disturbing the frontside oxide.

Current dry etch processes used for the nitride stripping step have the undesired effect of a significantly higher etch rate of silicon if the etchants reach the underlying substrate. For example, reference Kastenmeier et al. "Chemical Dry Etching of Silicon Nitride and Silicon Dioxide Using $CF_4$/$O_2$/$N_2$ Gas Mixtures," J. Vac. Sci. Technol. A 14(5), pp. 2802–2813 (1996). This article discloses that the silicon nitride etch rate in a chemical dry etch increases by a factor of two as oxygen is added to a $CF_4$ microwave discharge. The addition of $N_2$ to a $CF_4$/$O_2$ plasma increases the etch rate by an additional factor of seven. Both oxygen and nitrogen are thus found to be necessary to enhance the etch rate significantly. However, the article assumes a regime where fluorine atoms are available in abundance, and the process described again comprises a process wherein etching of exposed silicon occurs much faster than etching of nitride. For example, reference Matsuo et al. "Role of $N_2$ Addition on $CF_4$/$O_2$ Remote Plasma Chemical Dry Etching of Polycrystalline Silicon," J. Vac. Sci. Technol. A 15(4), pp. 1801–1813 (1997). This article discloses that the silicon etch rate (under conditions presented for the silicon nitride etch above) is a factor 10–15 higher than that of silicon nitride.

There thus exists a need in the art for a chemical dry etch process for highly selective etching of silicon nitride over both silicon and silicon dioxide. The present invention provides such a process.

DISCLOSURE OF THE INVENTION

Briefly summarized, this invention comprises in one aspect a method for chemical dry etching silicon nitride. The method includes: exposing the silicon nitride to a source of oxygen; and simultaneous therewith, exposing the silicon nitride to a source of fluorine, the source of fluorine being controlled so that oxidation of silicon is favored over etching of silicon so that etching of the silicon nitride produces an etch selectivity of silicon nitride to silicon greater than 5:1, and so that the etch rate of the silicon remains less than 1 nm/min.

As a more specific embodiment, the invention comprises exposing the layer of silicon nitride to a source of oxygen and a source of fluorine so that source of oxygen flow to source of fluorine flow is approximately 20:1 or greater (or 5:1 or greater if considering atomic fluorine flow), and the etch selectivity of silicon nitride to silicon is greater than 10:1. Further, the silicon nitride is preferably exposed to a gas mixture containing a source of oxygen and a source of nitrogen, wherein the source of oxygen has a flow rate in a range of 250–5000 sccm and the source of nitrogen has a flow rate in a range of 25–5000 sccm, wherein the source of fluorine is controlled so that etching of the silicon nitride proceeds in a fluorine-starved environment.

Advantageously, chemical dry etching in accordance with the principles of this invention produces much higher silicon nitride to silicon and silicon nitride to silicon dioxide etch rate ratios than currently possible using existing techniques. Chemical dry etching in accordance with this invention is robust and silicon surface roughening is unobserved, and in fact, surface smoothing appears to occur. The technique presented herein employs simple, non-hazardous gases and repairs porous silicon dioxide thin films, e.g., less than 5 nm thick. Further, the technique minimizes the so-called "loading effect", since it is based on a surface mechanism, thus simplifying tool design.

BRIEF DESCRIPTION OF THE DRAWINGS

The above-described objects, advantages and features of the present invention, as well as others, will be more readily understood from the following detailed description of certain preferred embodiments of the invention, when considered in conjunction with the accompanying drawings in which.

BEST MODE FOR CARRYING OUT THE INVENTION

Figure 1:
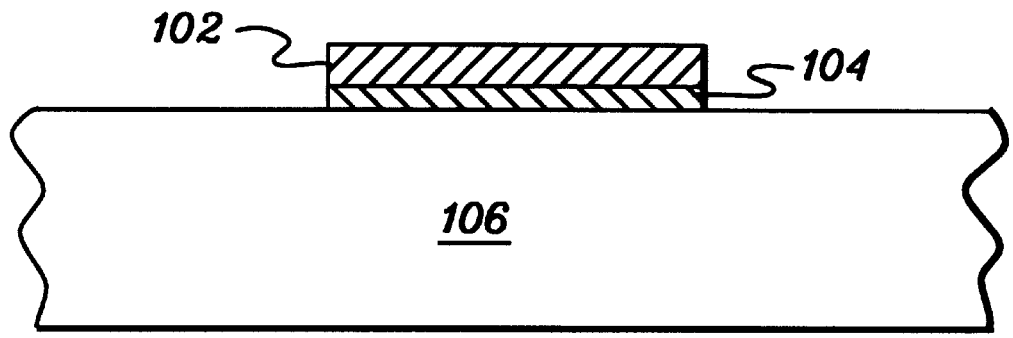
FIG. 1 is a cross-sectional view of a nitride mask 102 on pad oxide 104 over a silicon wafer 106.
Figure 2:
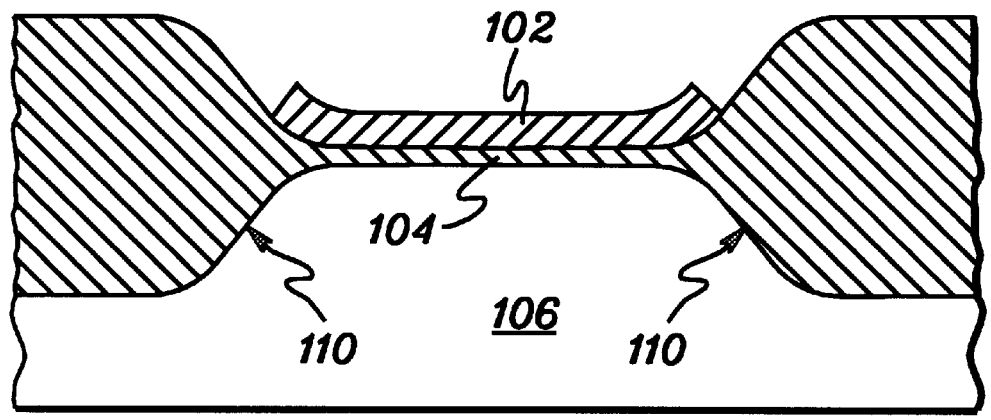
FIG. 2 is a cross-sectional view of the structure of FIG. 1 after thermal oxidation to form isolation oxide 110.

Generally stated, this invention comprises a new approach for the stripping of silicon nitride ($Si_3N_4$) layers in a silicon-based semiconductor fabrication process. (Unless otherwise indicated herein, "silicon" can refer to either single crystal silicon or polysilicon.) The approach employs a remote plasma oxygen/nitrogen discharge with small additions of a fluorine source, e.g., $CF_4$ or $NF_3$. Significant to the present invention is the maintenance of atomic fluorine in the reaction chamber at very low levels compared with prior chemical dry etching approaches. Further, in accordance with the present invention, maintenance of atomic fluorine at very low levels occurs in combination with maintaining an oxygen/nitrogen-rich environment within the reaction chamber.

Etch rates of $Si_3N_4$ of more than 30 nm/min can be achieved for $CF_4$ as a source of fluorine. The etch rate ratio of $Si_3N_4$ to polycrystalline silicon can be 35 or more in accordance with this invention, while silicon dioxide ($SiO_2$) is not etched at all. For $NF_3$ as a fluorine source, $Si_3N_4$ etches at a rate of 50 nm/min, while the observed etch rate ratios to polycrystalline silicon and $SiO_2$ are approximately 100 and 70, respectively. Within the chemical dry etching environment presented herein, in situ monochromatic ellipsometry shows the formation of an approximately 10 nm thick reactive layer on top of the polycrystalline silicon. This oxidized reactive layer beneficially suppresses etching reactions of the reactive gas phase species with the silicon. In particular, when low levels of a fluorine source are used in conjunction with these thick, oxide-like reaction layers, these etching reactions can be suppressed to a negligible value.

In prior work such as described in the above-referenced and incorporated article by Kastenmeier et al. entitled "Chemical Dry Etching of Silicon Nitride and Silicon Dioxide Using $CF_4/O_2/N_2$ Gas Mixtures," the etching of silicon nitride in the afterglow of certain $CF_4/O_2/N_2$ and $NF_3/O_2$ discharges was investigated. In these prior approaches, the flow of the fluorine source, $CF_4$ or $NF_3$, was kept at a relatively high constant value, and $O_2$ and $N_2$ were added in varying amounts. The constant fluorine source values employed were such that the reaction chamber was flooded with fluorine atoms during the etching of silicon nitride. The etch rate of silicon nitride was found to be correlated to the density of nitric oxide (NO) in a linear relationship for both gas mixtures. No similar correlation was found between the silicon nitride etch rates and the density of atomic fluorine.

In accordance with this invention, applicants have discovered that the F atom concentration (determined from the polycrystalline silicon etch rate and mass spectrometry) is higher by at least a factor of 20 than necessary to sustain the measured silicon nitride etch rates. Thus, we have concluded that the arrival of NO is the etch rate limiting step in silicon nitride etching, and fluorine atoms are available in abundance using prior techniques of silicon nitride etching.

The etch rates of silicon dioxide for the same parameters were found to be independent of the NO concentration, but followed the F radical density very well. The $CF_4$ based chemistry produces the desired etch rate ratio to silicon dioxide. With oxygen and nitrogen added to $CF_4$, ratios of 10 or slightly higher can easily be obtained. The etch rate of silicon nitride typically is 30 nm/min, and that of silicon dioxide 3 nm/min. The etch rates of silicon dioxide in the afterglow of $NF_3/O_2$ discharges were too high to achieve a selectivity to $Si_3N_4$; for example, typical etch rate values for $SiO_2$ and $Si_3N_4$ are 60 nm/min and 80 nm/min, respectively.

Etching of silicon always occurred at rates much faster than those of silicon nitride. Etch rates are as high as 300 nm/min for $CF_4/O_2/N_2$ and 700 nm/min for $NF_3/O_2$ gas mixtures at parameters identical to those for which the etch rates above for silicon nitride and silicon dioxide are given. These high etch rates can be explained with the high fluorine atom density and the spontaneous reaction of a silicon surface with fluorine atoms. In the absence of a prohibitive reaction layer, the etch rate of silicon has been found to be linear to the fluorine density. Further, a decrease of the silicon etch rate is consistently observed for additions of 20% or more $O_2$ to small flows of $CF_4$ or $NF_3$ plasma. This effect is due to the oxidation of the silicon surface in the presence of O or $O_2$. The oxidation makes the silicon surface very similar to that of silicon dioxide during etching, thus, in the limit of very high flows of $O_2$, and low flows of $CF_4$ or $NF_3$, the etch rates of both materials are nearly the same.

Based upon the above observations, presented herein is a new process for the etching of silicon nitride that gives high selectivities to both silicon dioxide and silicon. A mixture of $O_2$ and $N_2$ is used as the primary discharge gas, to which small amounts of fluorine source ($CF_4$ or $NF_3$) are admitted. This is important in that the $Si_3N_4$ etch rate becomes limited by the arrival of atomic fluorine, while the Si etch rate is limited by the thick oxide-like reaction layer that forms in the presence of such levels of oxygen and nitrogen. This allows for maximizing the $Si_3N_4$ etch rate, under the constraint that the Si etch rate remains negligible. In accordance with the principles of the present invention, three mechanisms contribute to a high silicon nitride/silicon selectivity which can be exploited by choosing an $O_2/N_2$ based chemistry, rather than a fluorine based chemistry. These three mechanisms are summarized below.

Oxidation of the silicon surface

The first mechanism employed by the present invention is the oxidation of the silicon surface in the presence of a high concentration of O and $O_2$ in the gas phase. This oxidation results from a shift in the balance between oxidation and fluorination of the Si controlled by maintaining low flows of the fluorine source with respect to the oxygen, e.g., $15Q_{(F\ source)} < Q_{O2}$. The resultant oxidized silicon surface, which forms in a few seconds, is very inert to the attack of fluorine atoms; and therefore, the silicon etch rate is significantly decreased. In addition to oxygen species, NO, which is produced by the $O_2/N_2$ discharge, has been found to contribute to the oxidation of silicon surfaces.

The equivalent flow of NO into the processing chamber that is sufficient to enhance this oxidation, while in the presence of oxygen and fluorine, is dependent on the level of fluorine introduced, as the oxidation and fluorination of the silicon are competing mechanisms. For example, in the systems containing high flows of a fluorine source (e.g., 400 sccm $CF_4$), the fluorine density can be controlled by admixing oxygen to the plasma. (See above-referenced article entitled, "Role of $N_2$ Addition on $CF_4/O_2$ Remote Plasma Chemical Dry Etching of Polycrystalline Silicon.") As the density of fluorine is decreased, the flow of NO required to enhance the oxidation, and hence quench the etching reaction, is decreased. In such a chemistry as proposed in the current invention, the fluorine density will be significantly lower than that produced by the 400 sccm of $CF_4$ cited in this example. It is therefore safe to assume that any equivalent flow of NO in excess of 10 sccm should be sufficient to produce such oxidation. Note that although such modest flows of NO are all that are required to boost the Si oxidation, there is no reason to limit these levels. Working in the regime where the chamber is flooded with nitrogen and oxygen species, yet where the Si etch reaction is fluorine starved, remains the secure method for achieving high etch selectivities. The surface of silicon nitride is also slightly oxidized during etching in the presence of O and $O_2$, but this does not appear to influence the $Si_3N_4$ etch rate.

Decreased F atom density

The second mechanism employed by the present invention is the limitation of the $Si_3N_4$ etch rate by the availability of atomic fluorine. This entails maintaining the density of atomic fluorine in the reaction chamber at very low levels compared to conventional $CF_4/O_2/N_2$ and $NF_3/O_2$ gas mixtures. For example, the parent gas of the fluorine source can be admixed in a flow ratio to oxygen <20 in accordance with the present invention. The silicon etch rate will respond to the reduction in the atomic fluorine density via two mechanisms: (1) the thickness of the oxide-like reaction layer, created by the high flows of oxygen and nitrogen, will increase, which will in turn reduce the reaction probability of any fluorine atom with the silicon; and (2) the total number of fluorine atoms for the reaction will be reduced. The etch rate of silicon nitride, on the other hand, is not affected as strongly because (1) by design, fluorine is available in abundance for the desired etch reaction, i.e., the weaker dependence of the $Si_3N_4$ etch rate than the Si etch rate on the F density can be exploited to starve the Si etching reaction, while maintaining sufficient fluorine to fuel the $Si_3N_4$ etch reaction, and (2) the reaction layer thickness on silicon nitride is quite thin.

$Si_3N_4$ etch rate enhancement by NO

The etch rate of $Si_3N_4$ is proportional to the density of NO. The $O_2/N_2$ chemistry described herein produces a significant amount of NO in its afterglow, which allows for high $Si_3N_4$ etch rates in the presence of sufficient fluorine. Silicon etch rate is less influenced by NO addition, and in the surface oxidation limited regime of the present invention, no enhancement of the etch rate is observed.

Etching in accordance with this invention naturally provides selectivity of $Si_3N_4$ over $SiO_2$ (in addition to selectivity of $Si_3N_4$ over Si). The etch rate of $SiO_2$, which in the absence of ion bombardment depends only on the fluorine density, is expected to be similar to that of the silicon etch rate or smaller. In the balance of this disclosure, the setup of a chemical dry etching tool in accordance with this invention and the experimental procedure employed are described. Etch rates of silicon nitride, polysilicon and silicon dioxide are reported for $CF_4$ and $NF_3$ as sources of atomic fluorine. Gas phase experiments (Ar actinometry and mass spectrometry) are conducted to gain information about the concentration of reactive species. The surface of polysilicon during etching is examined by ellipsometry, and the close correlation between the decrease of the etch rate and the formation of a reactive layer on the silicon is demonstrated.

Figure 3:
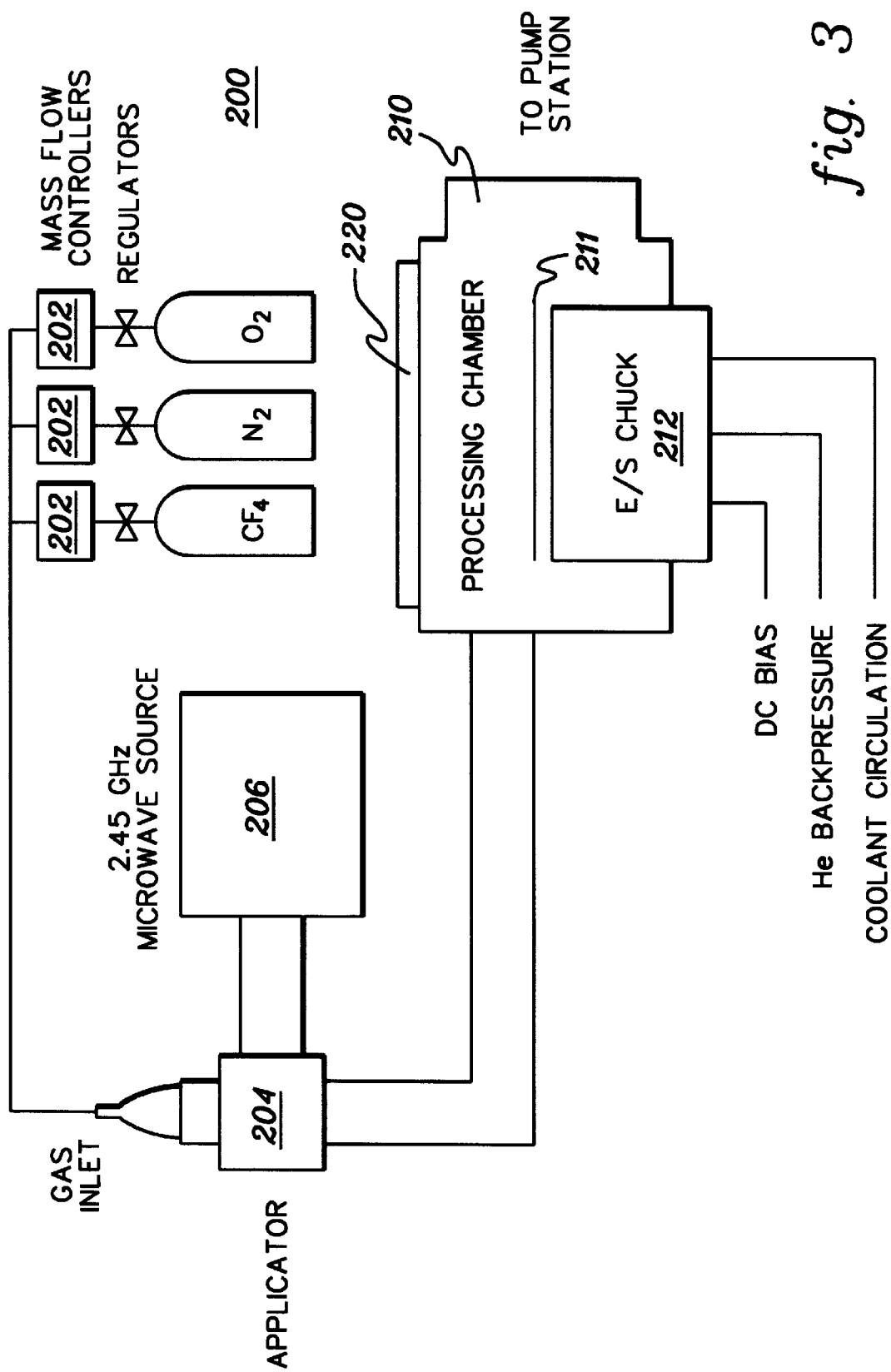
FIG. 3 depicts a schematic of chemical dry etch apparatus for use in accordance with the present invention.

FIG. 3 is a schematic of one embodiment of a chemical dry etch (CDE) apparatus, generally denoted 200, which can be used in accordance with the present invention. $CF_4$, $N_2$ and $O_2$ source gases in this example pass through respective mass flow controllers 202 and a gas inlet to an applicator 204. The mixtures of $O_2$, $N_2$ and fluorine source ($CF_4$ or $NF_3$) are excited using an Astex DPA-38 2.45 GHz microwave source 206 with a coupling tube to applicator 204. In most experiments, the plasma was ignited with a sapphire coupling tube. A fiber optic cable for optical emission experiments of the discharge is mounted on the housing of the applicator. One spectrograph useful in this investigation is a 30 cm optical multichannel analyzer.

The species produced in the plasma travel through a transport tube to the cylindrical reaction chamber. As one example, the length of the tube might be fixed at 75 cm, and its inside provided with a Teflon liner. Samples, e.g., of size 1 inch by 1 inch, are glued on a carrier wafer 211, which is placed on an electrostatic chuck 212 in the reaction chamber 210. The materials used for this investigation are low-pressure chemical vapor deposition (LPCVD) $Si_3N_4$, and thermally grown $SiO_2$. Surface modifications of Si have been studied using crystalline Si and polycrystalline Si, and etch rates of silicon are determined herein using polycrystalline silicon. The temperature of the sample is monitored with a fluoroptic probe which contacts the backside of the sample. The probe is kept constant at 10° C. for all experiments. Helium at a pressure of 5 Torr is fed between the surface of the electrostatic chuck 212 and the carrier wafer 211 in order to obtain good heat conduction. Etch rates are measured in situ by monochromatic ellipsometry (wavelength 632.8 nm). Some samples discussed herein were moved to the surface analysis chamber in the UHV wafer handling system without exposure to air. A quadrupole mass spectrometer 220 is mounted on top of the reaction chamber such that the distance orifice-discharge is the same as the distance sample-discharge.

Most experiments described herein were conducted with a sapphire applicator at 1000 W microwave power and a chamber pressure of 600 mTorr. Flows of $O_2$ and $N_2$ were kept constant at 800 sccm and 110 sccm, respectively. These parameters are referred to herein as the "standard conditions".

Etch rates and selectivities

Figure 4:
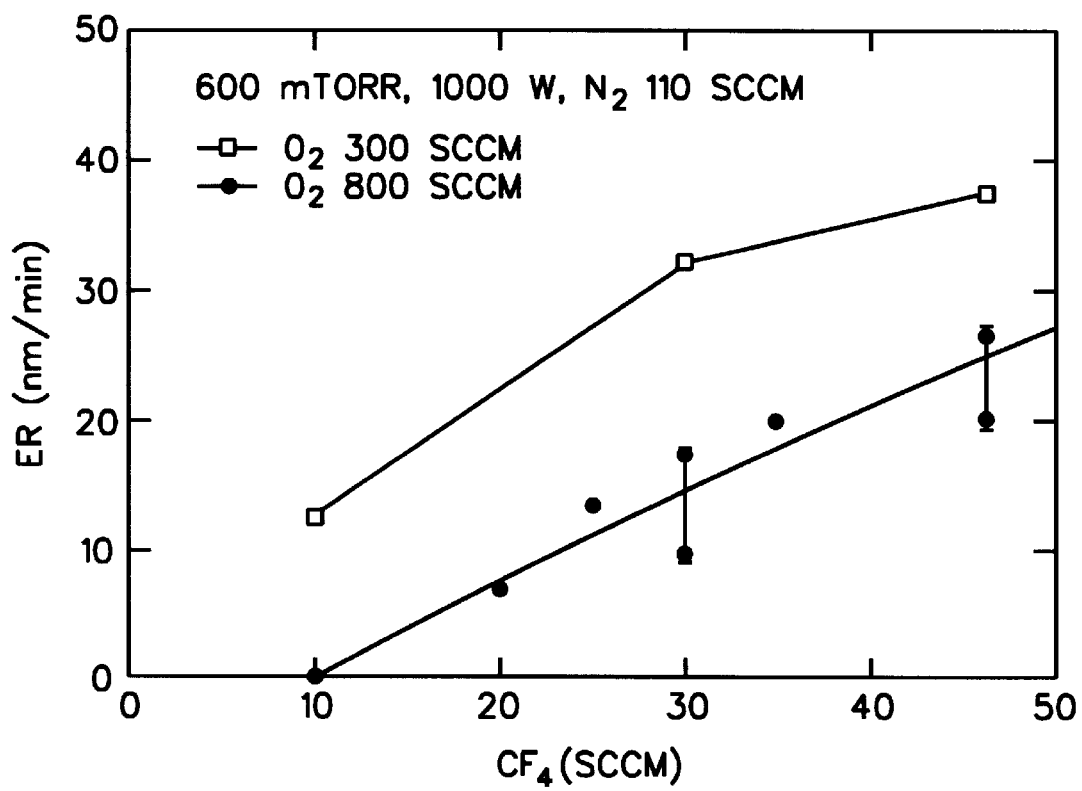
FIG. 4 is a graph of etch rates for silicon nitride as a function of the flow of $CF_4$ in $O_2/N_2$.

Pursuant to this invention, $Si_3N_4$ etch rates have been measured as a function of $CF_4$ addition to an $O_2/N_2$ plasma (see FIG. 4). The etch rate increases linearly with the flow of $CF_4$. The varied parameter for the two curves in FIG. 4 is the amount of oxygen fed into the discharge. A lower flow of $O_2$ (300 sccm) produces an etch rate about 15 nm/min higher than the higher flow of $O_2$ (800 sccm). The highest etch rates obtained with 46 sccm of $CF_4$ in $O_2/N_2$ are 25 nm/min for 800 sccm of $O_2$, and 39 nm/min for 300 sccm of $O_2$.

The etch rates of polycrystalline silicon were found to depend strongly on the initial surface conditions of the sample, and on the etch time. These etch rate variations can be explained by the presence of a native oxide layer on the Si surface, or the formation of an oxygen-rich surface layer during etching in accordance with this invention. A layer of native oxide on a polycrystalline silicon film suppresses the etching almost completely. As an example, the etch rate of poly-Si at standard conditions and 30 sccm of $CF_4$ is as low as 0.07 nm/min with the native oxide layer present. If the native oxide is removed immediately before processing by dipping the sample in HF for 30 s, the etch rate is 0.49 nm/min, which is almost one order of magnitude higher. Note that for $O_2$ flows of 300 sccm, despite the increased $Si_3N_4$ etch rate and high selectivity, the magnitude of the silicon etch rate is too high for a reliable process.

Figure 5:
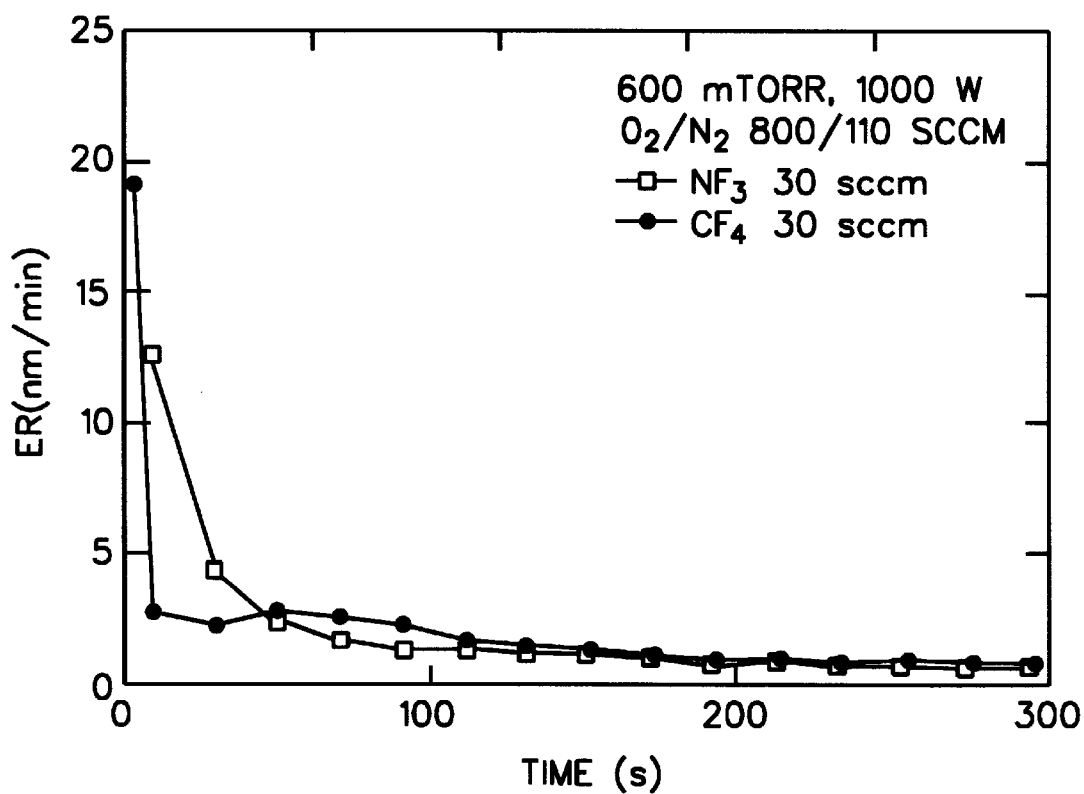
FIG. 5 is a graph of etch rates of polysilicon for $CF_4$ and $NF_3$ as source of fluorine at "standard conditions" (described herein), wherein samples were HF dipped before the experiments to remove the native oxide layer and the initial high etch rate is suppressed in accordance with the present invention as an oxygen-rich reactive layer forms during etching.

In FIG. 5 the etch rates of poly-Si are plotted as a function of time. The native oxide layer was removed before the experiments by HF dipping. Both samples were treated at standard conditions, with $CF_4$ and $NF_3$ as a source of fluorine. The etch rate of a "clean" Si surface (no native oxide and no reactive layer) can be as high as 20 nm/min. As etching proceeds, a reactive layer pursuant to the present invention forms on the Si and impedes etching reactions. The final etch rates are 0.50 nm/min for both $CF_4$ and $NF_3$. The etch rate decreases faster if $CF_4$ is used as fluorine source. Extrapolation of the curves to the x axis, using the initial slopes, yields 12 s for $CF_4$, and 40 s for $NF_3$ as estimates for the decay time. All etch rates reported in the following are "final" etch rates, taken after 300 s of etching.

Figure 6:
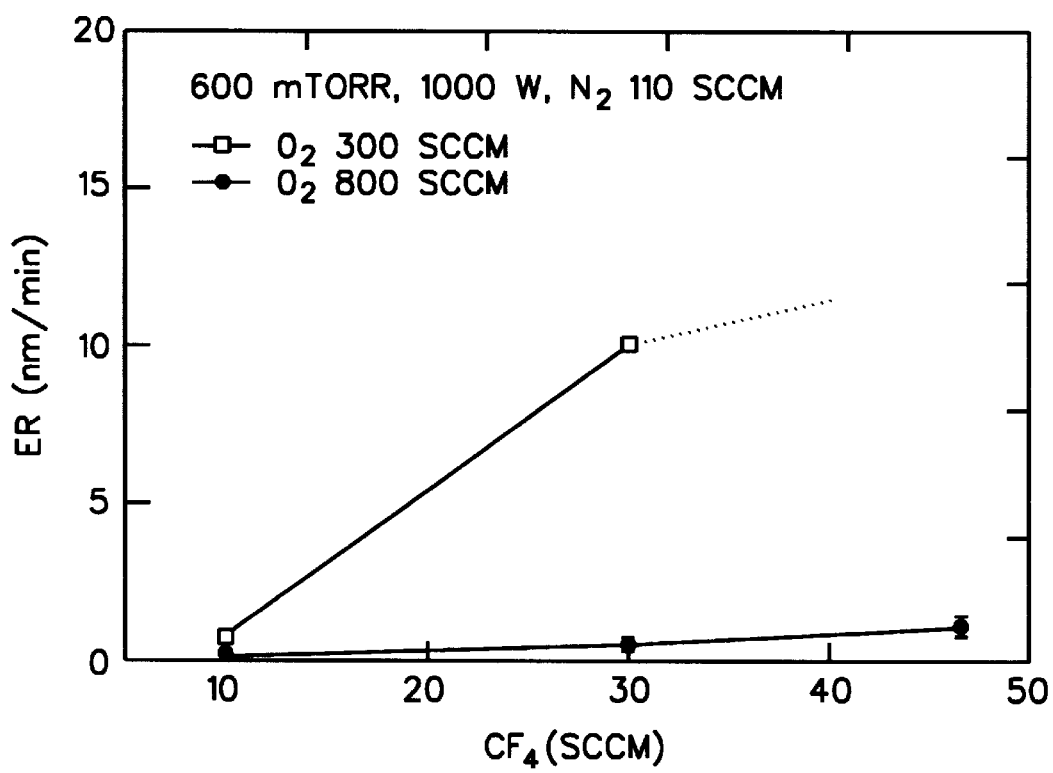
FIG. 6 is a graph of etch rates of polysilicon versus the flow of $CF_4$ for 300 and 800 sccm of oxygen (the ellipsometric determination of an etch rate for 300 sccm and flows of $CF_4$ higher than 30 sccm was not possible due to the formation of roughness or growth of an overlayer on top of the polysilicon)

FIG. 6 shows the etch rates of silicon for the "standard parameters" as a function of the flow of $CF_4$. The etch rates increase with the flow of $CF_4$. Strong variations of etch rate with the amount of $O_2$ fed into the plasma are also observed. The etch rate is significantly suppressed if 800 sccm of $O_2$ is used as proposed herein. No etch rate suppression is found at a low flow (300 sccm) of $O_2$. At 30 sccm of $CF_4$, for example, the etch rate for 300 sccm of $O_2$ is 19 times higher than that for 800 sccm.

Figure 7:
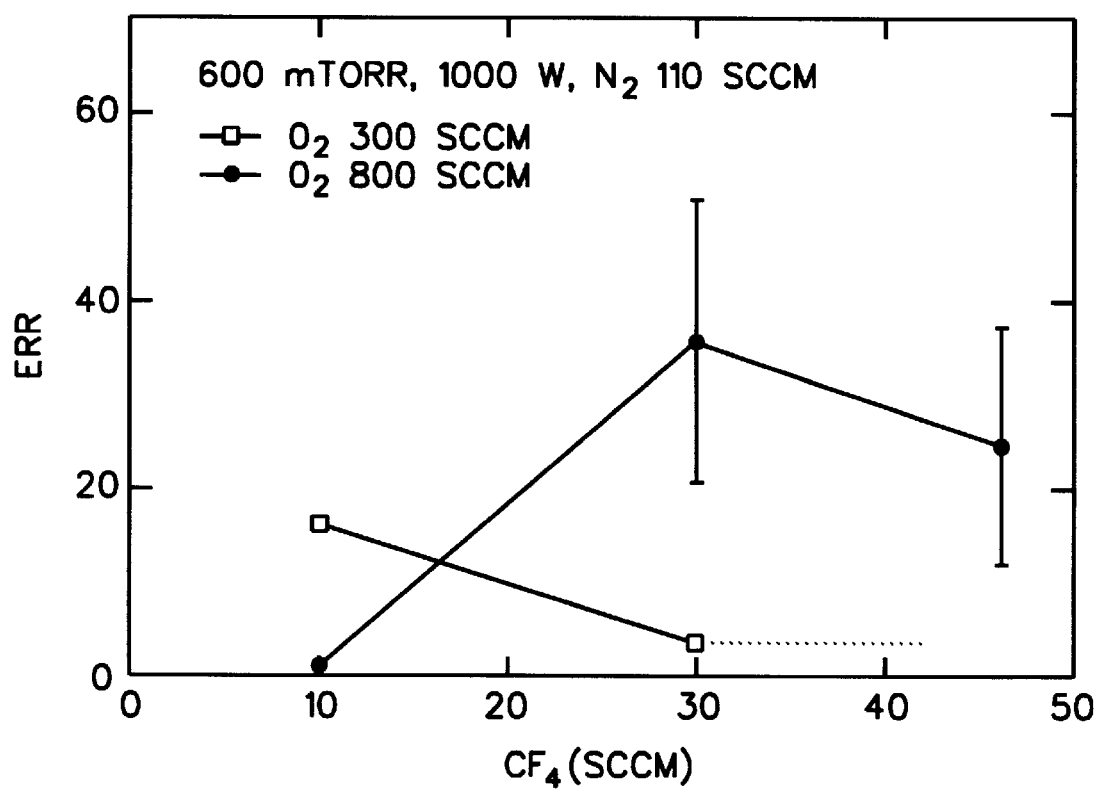
FIG. 7 is a graph of the etch rate ratio $Si_3N_4/Si$ determined from FIGS. 4 & 6.

The etch rate ratio obtained from FIG. 4 and FIG. 6 is plotted in FIG. 7. The best selectivity is achieved for a high flow of $O_2$ and low or intermediate fluorine additions.

Figure 8:
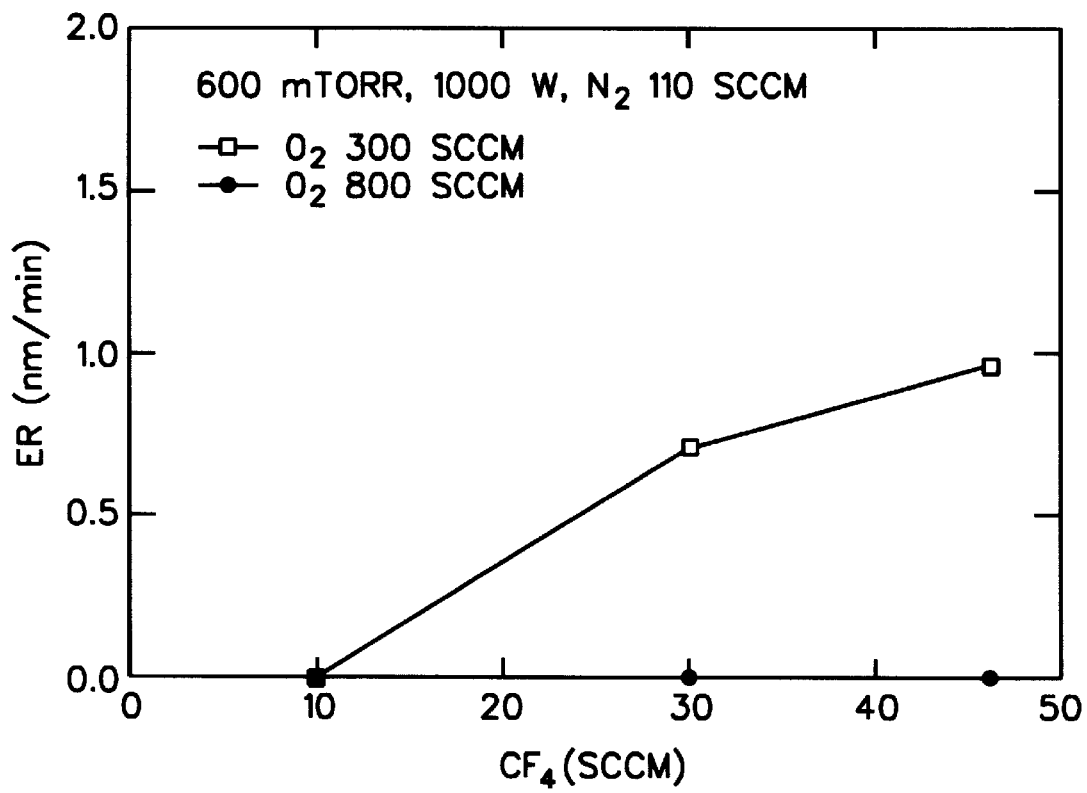
FIG. 8 is a graph of etch rate of silicon dioxide.

The etch rates of silicon dioxide are plotted in FIG. 8. Etching occurs only at the low flow of $O_2$ (300 sccm), and etch rates never exceed 1 nm/min. The other etch rates are too small to be detected by ellipsometry (<0.05 nm/min). Therefore, the etch selectivity of $Si_3N_4$ to $SiO_2$ at the higher flow of $O_2$ is extremely high (>500 nm/min, or infinity). Note that in accordance with present invention, a flow of oxygen anywhere in the range of 250–5000 sccm is believed to produce practical chemical dry etching when used in combination with an atomic fluorine flow of approximately the same ratios as used in the stated standard conditions. Nitrogen flows of 25–5000 sccm could be implemented, again in accordance with maintaining a $N_2:O_2$ ratio between 0.1 and 1.0. Simply stated, although 800 sccm of oxygen and 110 sccm of nitrogen are presented as preferable examples, those skilled in the art will recognize that various combinations of flow of nitrogen and oxygen may be used without departing from the scope of the present invention. The goal is to produce a flooding of the reaction chamber with oxygen and nitrogen and a commensurate limiting of atomic fluorine within the chamber, for example, within the range of 2 to 20 sccm. Such an atomic fluorine level can be attained by limiting the $CF_4$ source flow to less than 50 sccm.

$NF_3$ as fluorine source $NF_3$ was also used as an alternate fluorine source to $CF_4$. The plasma chemistry of $NF_3$ is significantly different than that of $CF_4$. The dissociation energies for $NF_3$ are lower than those for $CF_4$. This results in a higher degree of dissociation of $NF_3$ in a discharge. In fact, in the high density microwave discharges employed for the work reported here, 100% dissociation is typically achieved. The dissociation of $CF_4$ for similar discharge parameters varies between 40% and 60%. Therefore, the F production of free fluorine radicals from $NF_3$ is higher than from $CF_4$ and thus a lower flow rate of $NF_3$ source would be needed to produce, e.g., a 15 sccm flow rate of atomic fluorine within the reaction chamber. Moreover, the concentration of NO in the afterglow of the discharge might be affected by the additional N atom feed. This enhancement of the NO production can result in more pronounced Si oxidation, while at the same time increasing the $Si_3N_4$ etch rate, thus improving the selectivity.

Figure 9:
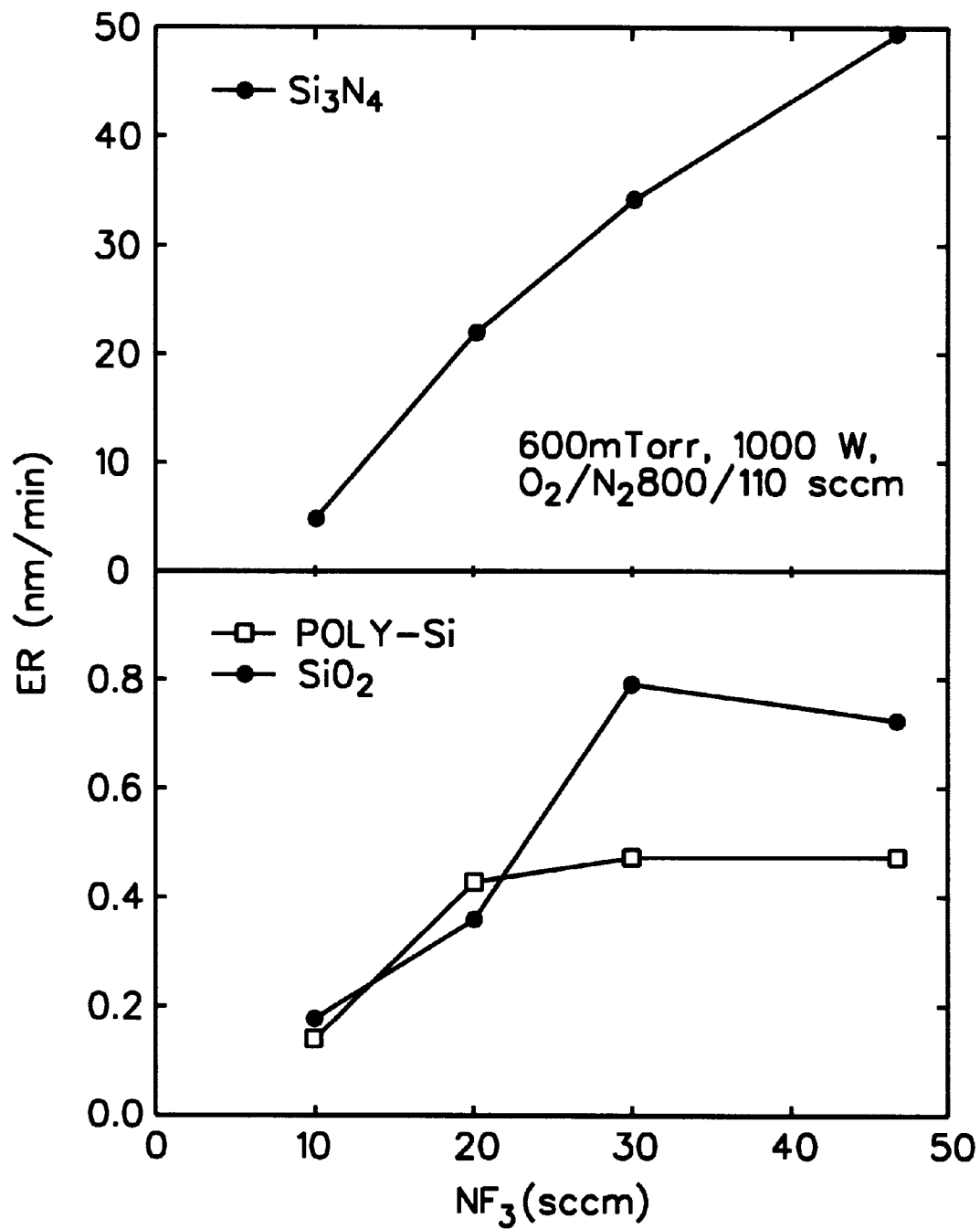
FIG. 9 is a graph of etch rates of silicon nitride (top panel) and polysilicon and silicon dioxide (bottom panel) as a function of $NF_3$ addition.

The etch rates of $Si_3N_4$, poly-Si and $SiO_2$ as a function of the flow of $NF_3$ are shown in FIG. 9. All experiments were performed under "standard conditions", i.e., the flow of $O_2$ was kept constant at 800 sccm. The etch rates of $Si_3N_4$ are proportional to the flow of $NF_3$, and significantly higher if $NF_3$ is used instead of $CF_4$. An addition of 46 sccm of $CF_4$, e.g., yields an etch rate of 24 nm/min, whereas the etch rate for the same flow of $NF_3$ is twice as high (49 nm/min).

Figure 10:
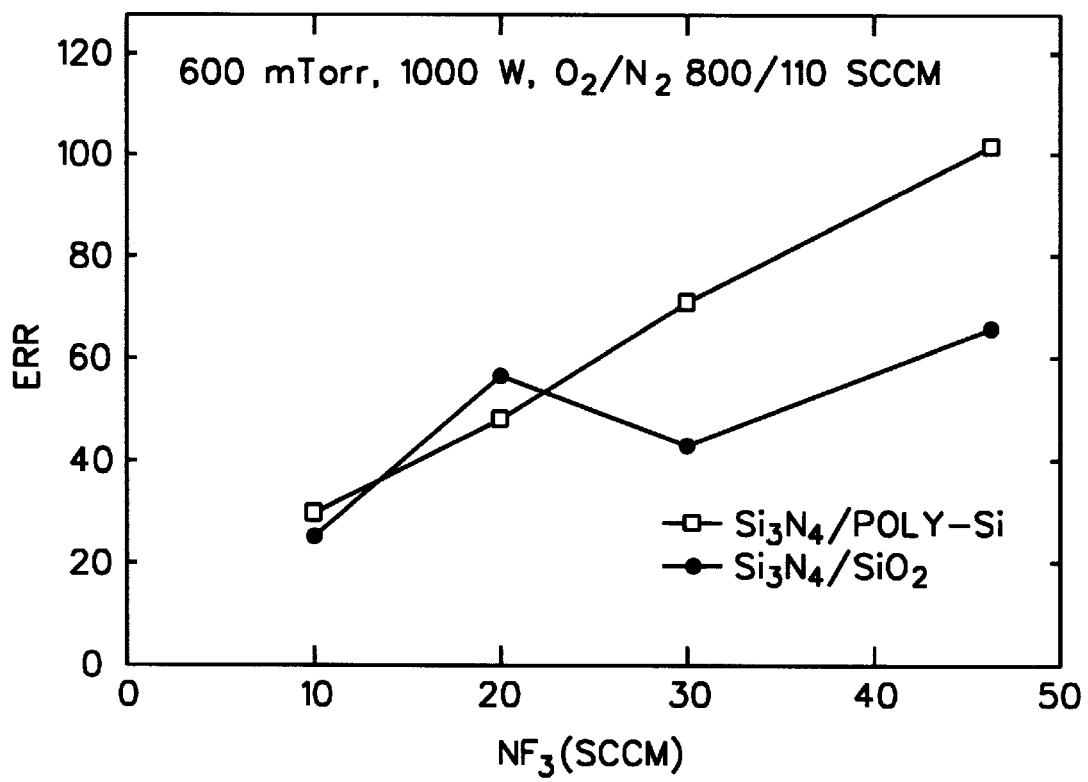
FIG. 10 is a graph of selectivities of $Si_3N_4$ to polysilicon and $SiO_2$ determined from data depicted in FIG. 9.

The etch rates of poly-Si and $SiO_2$ (see FIG. 9) show a different trend for $NF_3$ as compared to $CF_4$. The etch rates of both materials increase with the flow of $CF_4$, but they assume a plateau value if $NF_3$ is used. The etch rate ratios resulting from this data are plotted is FIG. 10. The selectivity of $Si_3N_4$ to both materials, poly-Si and $SiO_2$, increases with the flow of $NF_3$. Those skilled in the art will note that the degree of disassociation, and hence the density of fluorine available for etching reactions, can be enhanced by increasing the microwave power. Further, the proposed flows of fluorine source can be altered by one skilled in the art with respect to the oxygen and nitrogen flows by manipulating the degree to which the source gasses are disassociated.

Gas phase experiments

This section gives a summary of gas phase experiments which were performed to determine the dependence of the reactive species concentration on the process parameters. Due to technical difficulties, the experiments reported in this section were not conducted under standard conditions. A quartz applicator was used instead of the sapphire one, the microwave power was reduced to 500 W, and the flow of $O_2$ was kept constant at 600 sccm. The etch rates under these conditions were measured and compared to the etch rates for standard conditions. The etch rates of $Si_3N_4$, when $CF_4$ was used as F source, are 50% of those reported above for the standard conditions. The etch rates for $NF_3$ are identical. Polycrystalline Si shows the same etch characteristics for both parameter settings. Silicon dioxide was not etched when $CF_4$ was used, and etched at a rate of 1 nm/min or less if $NF_3$ was used. The close agreement between the etch rates for the parameters used in this section and the standard parameters suggests that the gas phase results can be applied qualitatively to the "standard conditions" noted above.

Figure 11:
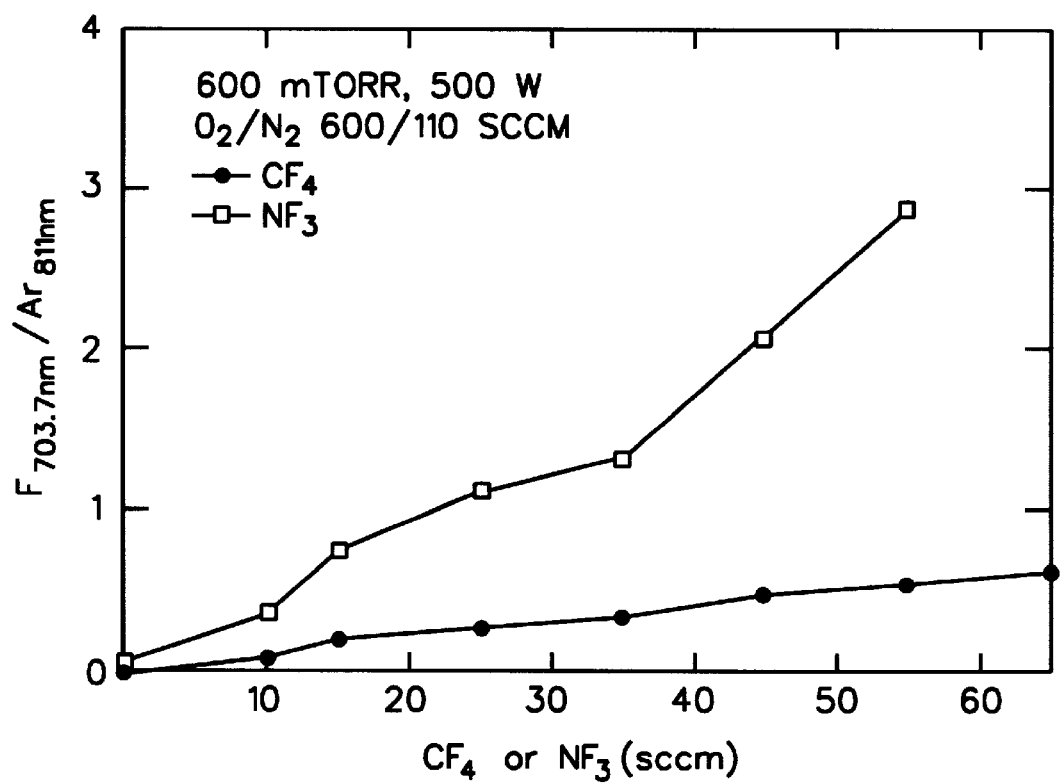
FIG. 11 depicts variation of the F atom concentration in the discharge region, as determined by Ar actinometry.
Figure 12:
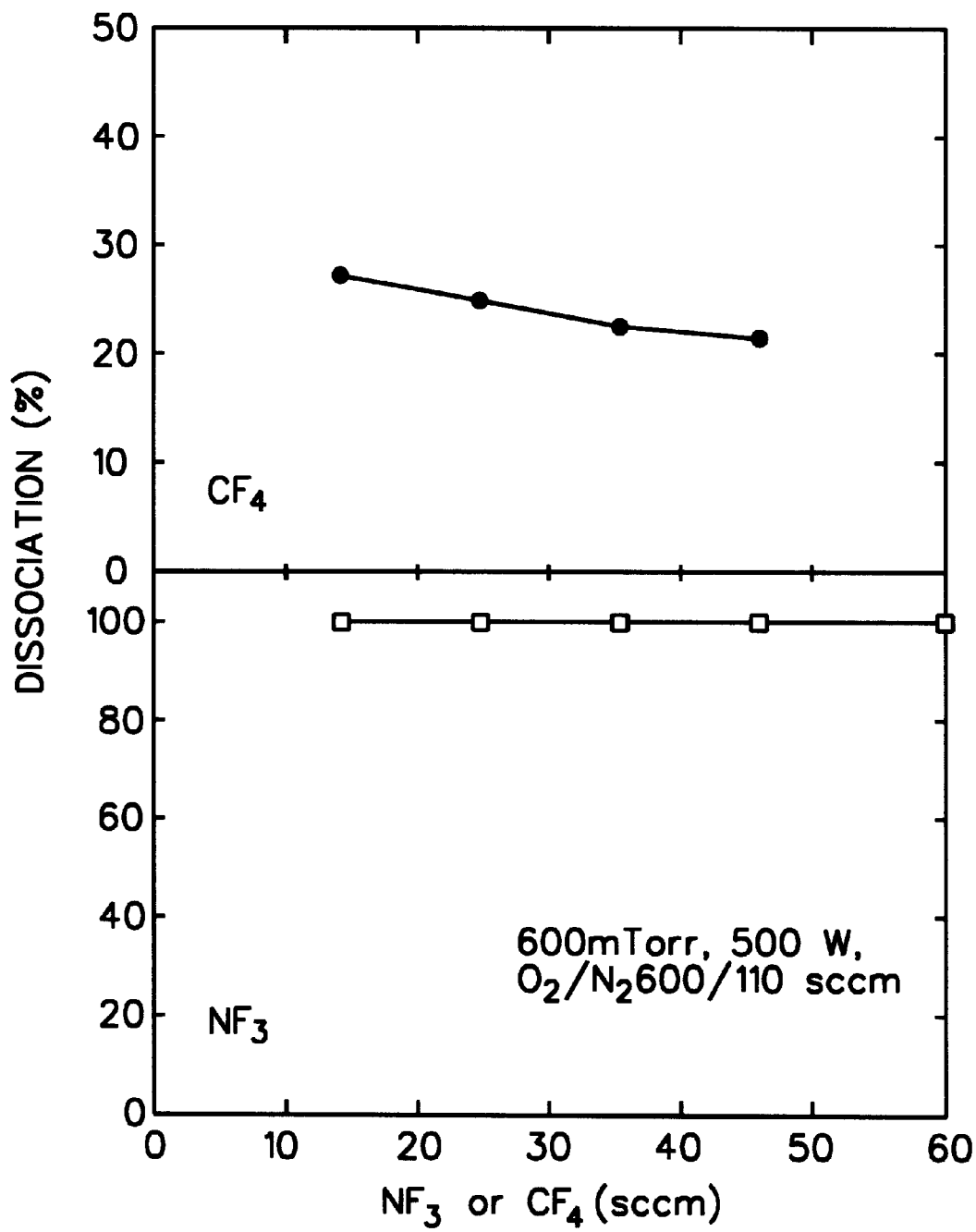
FIG. 12 depicts dissociation of $CF_4$ and $NF_3$, determined by mass spectrometry.

The fluorine generation in the plasma was monitored using Ar actinometry. FIG. 11 shows the ratio of the F emission at 703.7 nm and the Ar line at 811 nm. The F concentration is approximately 4 times higher if $NF_3$ is used as compared to $CF_4$. This is consistent with the observation that $NF_3$ dissociates to a higher degree than $CF_4$ in discharges. This fact is shown for $CF_4$ and $NF_3$ in FIG. 12 for the present experiments. The dissociation is determined by mass spectrometry from the intensity ratio $I_{PlasmaOn}/I_{PlasmaOff}$ of the $CF_3^+$ (amu 69) and the $NF_2^+$ (amu 52) peaks. The dissociation of $CF_4$ ranges between 20% and 30%, whereas that of $NF_3$ is always 100%.

Figure 13:
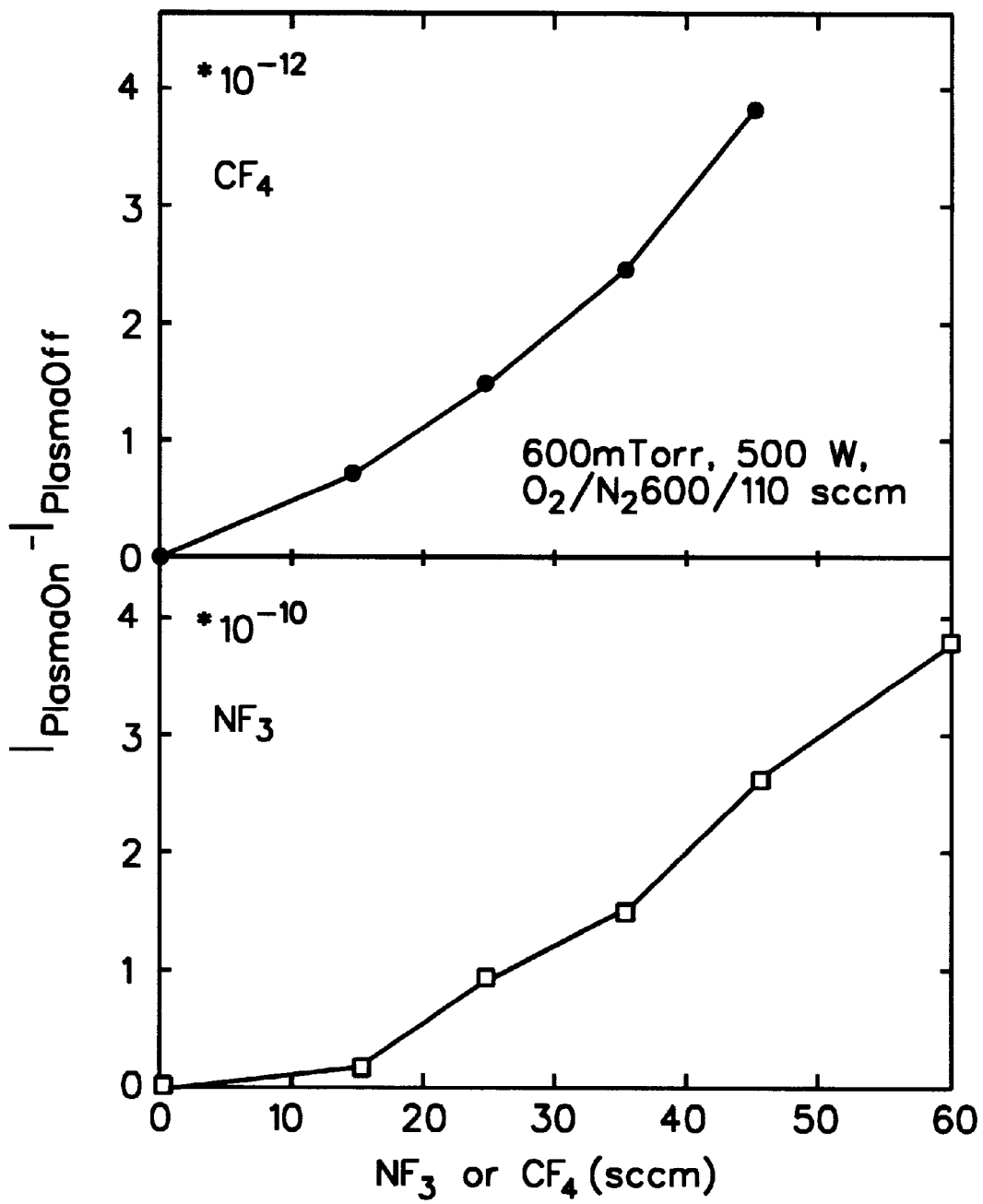
FIG. 13 is a graph of the density of atomic F in the reaction chamber for $CF_4$ and $NF_3$ as fluorine source (note that the range of the ordinates differ by two orders of magnitude)
Figure 14:
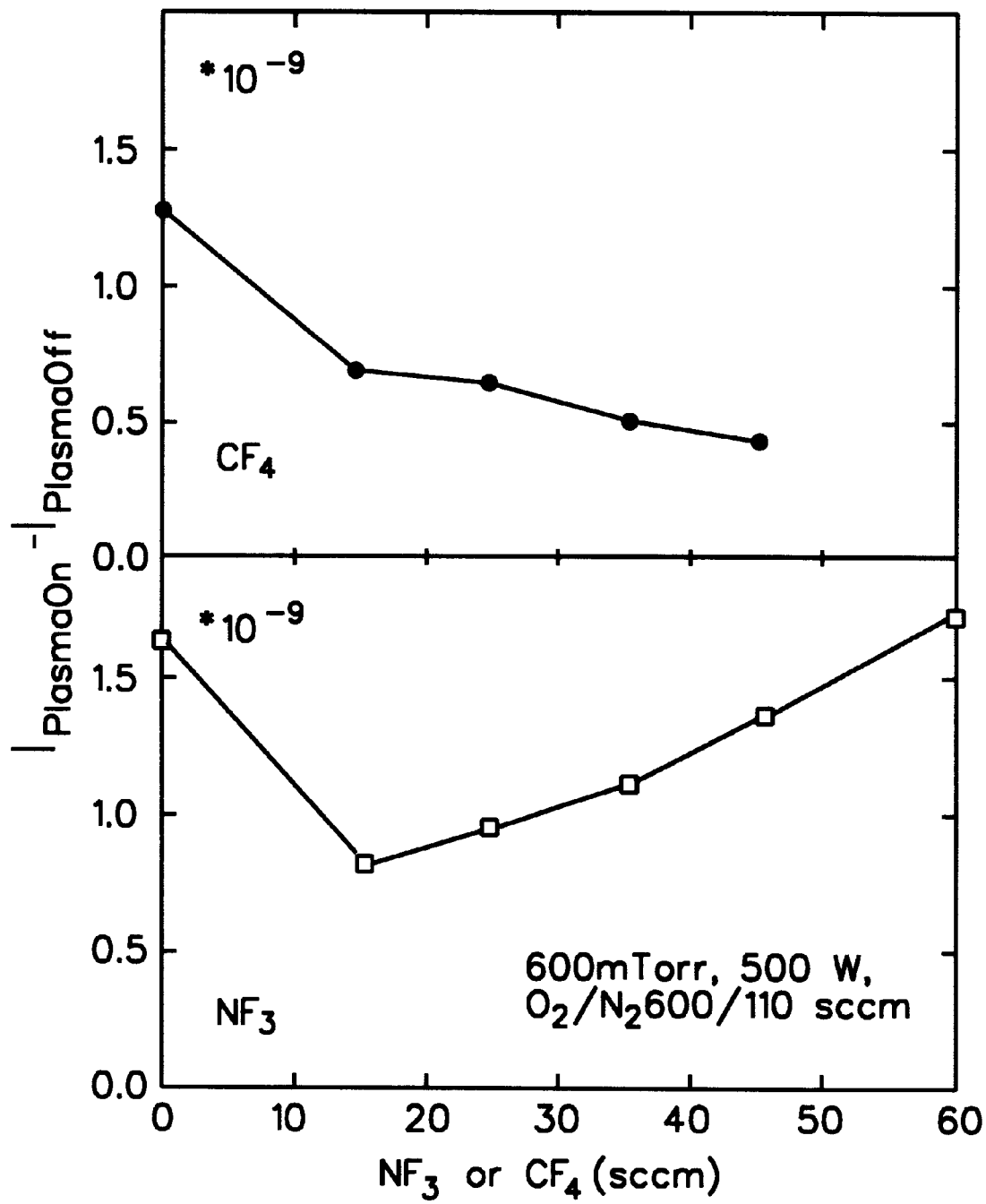
FIG. 14 depicts NO concentration in the reaction chamber for $CF_4$ fluorine source and $NF_3$ fluorine source.

The densities of atomic fluorine and NO in the reaction chamber, as determined by mass spectrometry, are shown in FIG. 13 and FIG. 14. $NF_3$ produces an F atom density two orders of magnitude greater than that produced by $CF_4$. Significant amounts of NO are present in the afterglows of both gas chemistries. In the case of $CF_4$, however, the density decreases by almost 50% as a small amount of $CF_4$ (15 sccm) is added to the $O_2/N_2$ discharge, and then decreases further as more $CF_4$ is injected. The same initial decrease is observed for $NF_3$ added to $O_2/N_2$, but then, in contrast to the $CF_4$ case, the NO density increases. The higher densities of F and NO for $NF_3$ as compared to $CF_4$ can account for the increased $Si_3N_4$ etch rates, and also for the different surface kinetics during poly-Si etching, as described below.

Surface analysis

The surface modifications during the etching of silicon have been investigated in situ by monochromatic ellipsometry and after the experiment by x-ray photoelectron spectroscopy.

A. Ellipsometry measurements

Figure 15:
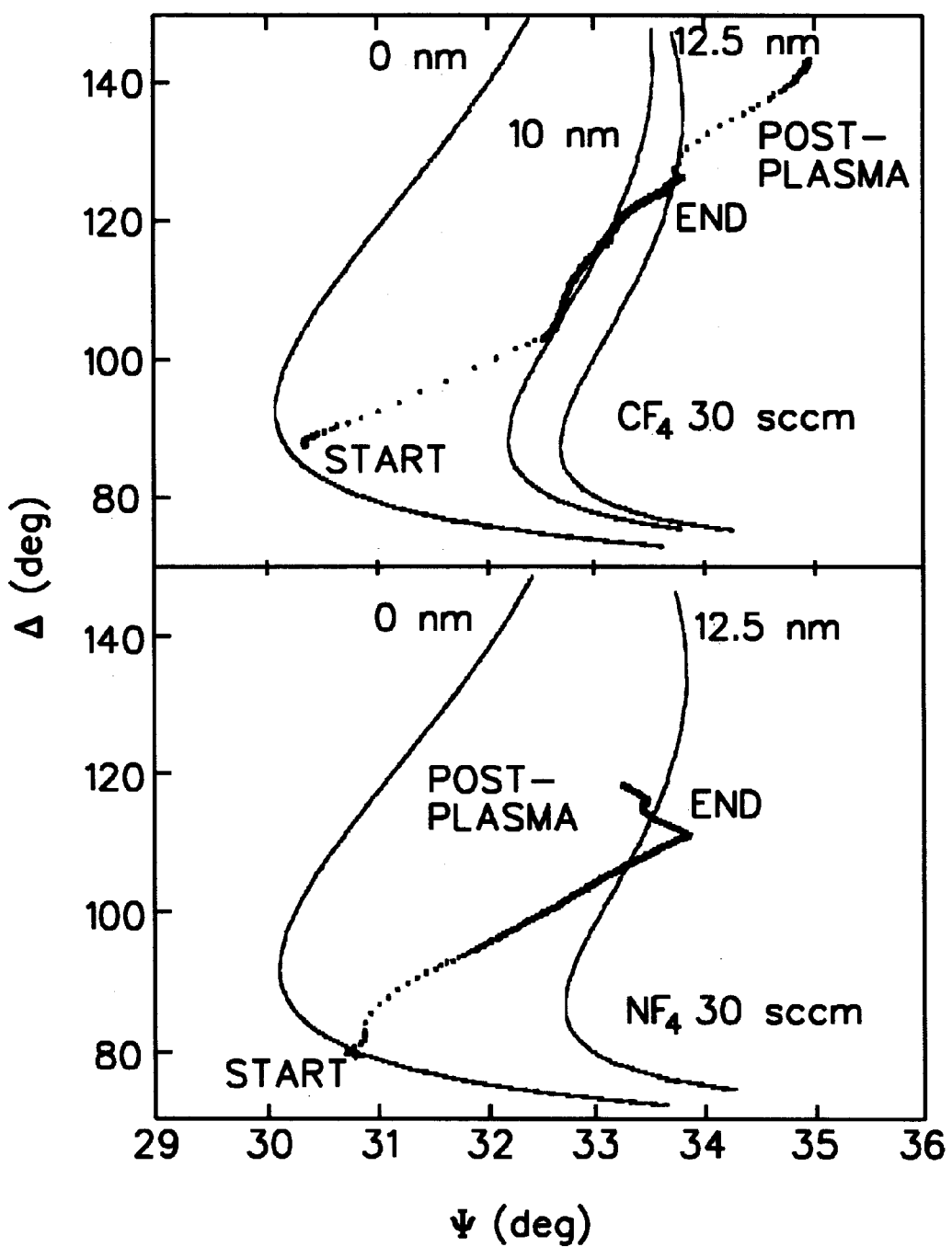
FIG. 15 depicts the evolution of the ellipsometric variables $\psi$ and $\Delta$ during the etching of a film of polycrystalline silicon (total thickness 250 nm) on a silicon dioxide layer (100 nm) on a silicon (100) substrate, wherein experiments were performed under "standard conditions", with addition of 30 sccm of $CF_4$ (top panel) or 30 sccm of $NF_3$ (bottom panel); and wherein the time interval between two data points is 1.1 s and simulations of the $\psi/\Delta$ for different reactive layer thicknesses (0 nm, 10 nm and 12.5 nm) on top of the polysilicon are included; an increase in $\Delta$ is equivalent to removal of polysilicon, while an increase in $\psi$ means the growth of the oxide reactive layer in accordance with the present invention.

The formation of the reactive layer on top of the polycrystalline silicon to be etched can be monitored in situ during etch rate measurements. FIG. 15 shows the evolution of the ellipsometric variables $\psi$ and $\Delta$ as a function of time. For these experiments, a stack consisting of poly-Si (total thickness 250 nm) on top of $SiO_2$ (100 nm) on a Si (100) substrate has been etched. $\psi$ and $\Delta$ can be calculated by assuming values for the thickness and the optical parameters of each layer of the stack. Also, the reactive layer can be included in those calculations as a film of variable thickness on top of the poly-Si. In FIG. 15 the results of these calculations for three different thicknesses of the reactive layer (0 nm, 10 nm and 12.5 nm) are included. Etching of the poly-Si corresponds to an increase of the value of $\Delta$. At the same time, information about the reactive layer thickness is obtained from $\psi$. An increase of $\psi$ means an increase of the reactive layer thickness.

The top panel of FIG. 15 shows the etching of polycrystalline Si and formation of the reactive layer under standard conditions with 30 sccm of $CF_4$ added. Immediately after the plasma is ignited and tuned ("start") the reactive layer grows at considerable rate, and Si is removed at the same time. The time interval between two measurement points is 1.1 s. The reactive layer assumes a steady state thickness of approximately 10 nm. At this thickness value the etch rate of Si is slowed down to 0.4 nm/min. At the moment the discharge is terminated ("end"), the overlayer thickness has increased to about 12.5 nm. The etch time from start to end was 475 s, and 16.7 nm of Si was removed in that time. After termination of the discharge ("post-plasma"), more surface modifications occurred.

$NF_3$ was used instead of $CF_4$ for the experiment shown in the bottom panel. As in the case of $CF_4$, growth of the reactive layer and poly-Si etching occur simultaneously. However, some significant differences are observed: The formation of the reactive layer happens at a slower rate than in the case of $CF_4$ etching, and the reactive layer does not achieve a steady state thickness, but continues to grow. Also, the post-plasma modifications show a different trend.

XPS measurements

Figure 16:
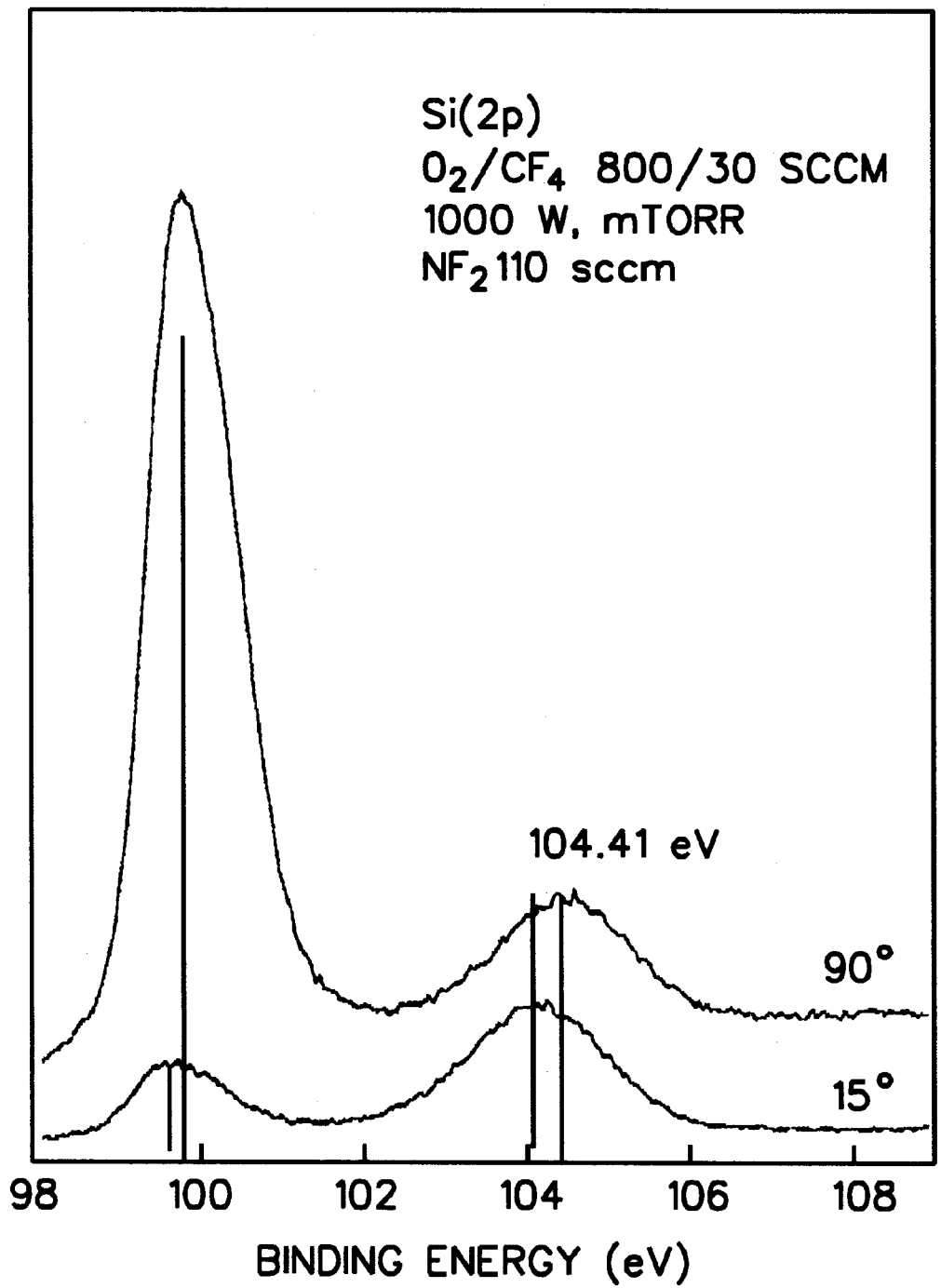
FIG. 16 depicts the spectra of the Si(2p) emission, taken under electron emission angles of 15° and 90° with respect to the surface.

Photoemission spectra have been taken from crystalline Si substrates which have been etched under standard conditions. FIG. 16 shows the Si(2p) spectra of a representative sample, etched under "standard conditions". The spectrum which was taken with an electron emission angle of 15° with respect to the surface shows a relatively strong peak at high binding energy (104 eV), which corresponds to a high degree of surface oxidation. If the $e^-$ emission angle is changed to 90°, the Si(2p) emission from the bulk (99.6 Ev) increases and becomes stronger than the emission from oxidized Si. The relative intensity of the two peaks allows one to estimate the thickness of the oxidized overlayer. For the spectra shown, this thickness is about 2 nm.

Conclusions

A novel remote plasma Chemical Dry Etching (CDE) process which enables etching of $Si_3N_4$ over silicon and $SiO_2$ with an etch rate ratio greater than 10:1 (and even greater than 30:1) has been demonstrated. It uses high flows of $O_2$ and $N_2$, and relatively small additions of $CF_4$ or $NF_3$ as a source of fluorine.

From the data presented above, it can be concluded that the formation of an etch-inhibiting reactive layer on top of the Si is the dominant mechanism for achieving a high $Si_3N_4$/Si etch rate ratio. Conventionally, the etching of the virgin silicon surface proceeds at a rate of approximately 20 nm/min. In accordance with the present invention, in situ ellipsometry shows the formation of a reactive layer on top of the polycrystalline silicon during the etch process within a matter of seconds. The etch rate of silicon is thus decreased to a level comparable to that of $SiO_2$ after the reactive layer has formed, and the significantly decreased F atom density, therefore, facilitates etching of silicon nitride with high selectivity over silicon. The silicon nitride etch rate is further boosted by high NO density in the chamber.

Those skilled in the art will note from the above discussion that chemical dry etching in accordance with the principles of this invention produces much higher silicon nitride to silicon and silicon nitride to silicon dioxide etch rate ratios than currently possible using existing techniques. Further, the highly selective chemical dry etching processes presented comprise practical implementations for removing a silicon nitride mask from a silicon-based wafer. This chemical dry etching approach is robust and silicon surface roughening is unobserved, and in fact, surface smoothing appears to occur. The technique presented employs simple, non-hazardous gases and repairs porous silicon dioxide thin films. Further, the technique minimizes so-called "loading effect", since it is based on a surface mechanism, thus simplifying tool design.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

We claim:

1. A method for etching a layer of silicon nitride, the method comprising simultaneously exposing said layer to a source of oxygen, a source of nitrogen and a source of fluorine, wherein the ratio of the source of oxygen to the source of fluorine is greater than 20:1.

2. A method according to claim 1, wherein the ratio of the source of oxygen to the source of nitrogen is in the range of about 1:0.1 to 1:1.

3. A method according to claim 2, wherein the source of oxygen is provided at a rate of between 250 and 5000 sccm, the source of nitrogen is provided at a rate of between 25 and 5000 sccm.

4. A method according to claim 3, wherein the source of oxygen is provided at a rate of about 800 sccm, the source of nitrogen is provided at a rate of about 100 sccm and the source of fluorine is provided at a rate of less than about 50 sccm.

5. A method according to claim 1, wherein the source of fluorine is chosen from $CF_4$ gas and $NF_3$ gas.

6. A method according to claim 5, wherein the source of oxygen is $O_2$ gas and the source of nitrogen is $N_2$ gas.

7. A method according to claim 1, wherein the layer of silicon nitride is disposed over a layer of silicon or silicon dioxide and the ratio of the etch rate of the silicon nitride to the etch rate of the silicon or the silicon dioxide is greater than 10:1.

8. The method according to claim 7, wherein the layer of silicon nitride is disposed over a layer of silicon, the source of the fluorine is $CF_4$ and the ratio of the etch rate of the silicon nitride to the etch rate of the silicon is greater than 35:1.

9. A method according to claim 7, wherein the layer of silicon nitride is disposed over a layer of silicon dioxide, the source of the fluorine is $CF_4$ and the silicon dioxide is not etched.

10. The method according to claim 7, wherein the layer of silicon nitride is disposed over a layer of silicon, the source of the fluorine is $NF_3$ and the ratio of the etch rate of the silicon nitride to the etch rate of the silicon is 100:1.

11. The method according to claim 7, wherein the layer of silicon nitride is disposed over a layer of silicon dioxide, the source of the fluorine is $NF_3$ and the ratio of the etch rate of the silicon nitride to the etch rate of the silicon dioxide is 70:1.

* * * * *